United States Patent
West et al.

(10) Patent No.: US 10,811,492 B2
(45) Date of Patent: Oct. 20, 2020

(54) METHOD AND DEVICE FOR PATTERNING THICK LAYERS

(71) Applicant: TEXAS INSTRUMENTS INCORPORATED, Dallas, TX (US)

(72) Inventors: Jeffrey Alan West, Dallas, TX (US); Byron Lovell Williams, Plano, TX (US); John Britton Robbins, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/176,278

(22) Filed: Oct. 31, 2018

(65) Prior Publication Data
US 2020/0135841 A1    Apr. 30, 2020

(51) Int. Cl.
H01L 21/027 (2006.01)
H01L 49/02 (2006.01)
H01L 23/544 (2006.01)
G03F 7/20 (2006.01)
G03F 1/42 (2012.01)
G03F 7/16 (2006.01)

(52) U.S. Cl.
CPC .............. *H01L 28/60* (2013.01); *G03F 1/42* (2013.01); *G03F 7/16* (2013.01); *G03F 7/20* (2013.01); *H01L 21/0274* (2013.01); *H01L 23/544* (2013.01); *H01L 2223/54426* (2013.01)

(58) Field of Classification Search
CPC ... H01L 28/60; H01L 21/0274; H01L 23/544; G03F 1/42; G03F 7/16; G03F 7/20
See application file for complete search history.

(56) References Cited

U.S. PATENT DOCUMENTS

| | | | |
|---|---|---|---|
| 5,538,819 | A | 7/1996 | DeMarco |
| 5,589,303 | A | 12/1996 | DeMarco |
| 5,633,103 | A | 5/1997 | DeMarco |
| 5,888,677 | A | 3/1999 | Nakae |
| 5,935,736 | A | 8/1999 | Tzu |
| 6,551,750 | B2 | 4/2003 | Pierrat |
| 6,852,455 | B1 | 2/2005 | Lyons |
| 6,893,779 | B2 | 5/2005 | Kim |
| 7,642,019 | B2 | 1/2010 | Kim |
| 9,525,021 | B2 | 12/2016 | West |

(Continued)

FOREIGN PATENT DOCUMENTS

| | | |
|---|---|---|
| JP | H1010700 A | 1/1998 |
| JP | H10239827 A | 9/1998 |

(Continued)

*Primary Examiner* — Nathan W Ha
(74) *Attorney, Agent, or Firm* — Jacqueline J. Garner; Charles A. Brill; Frank D. Cimino

(57) ABSTRACT

A method of fabricating an integrated circuit includes applying photoresist to a MESA dielectric layer of a semiconductor structure, to generate a photoresist layer. The method also includes exposing the photoresist layer with a grayscale mask, to generate an exposed photoresist layer. The photoresist exposed layer includes a thick photoresist pattern in a first region, a thin photoresist pattern in a second region where a height of the thin photoresist pattern is less than half a height of the thick photoresist pattern, and a gap region between the thick photoresist pattern and the thin photoresist pattern.

20 Claims, 13 Drawing Sheets

(56) References Cited

U.S. PATENT DOCUMENTS

| | | |
|---|---|---|
| 2006/0234137 A1 | 10/2006 | Kim |
| 2007/0207391 A1 | 9/2007 | Lee |
| 2008/0160422 A1 | 7/2008 | Chen |
| 2009/0023098 A1* | 1/2009 | Jain .................... H01L 21/0277 430/296 |
| 2009/0220867 A1 | 9/2009 | Fujikawa |
| 2013/0049086 A1* | 2/2013 | Ahn ..................... H01L 27/105 257/296 |
| 2013/0236658 A1* | 9/2013 | Sato ........................ B05D 1/36 427/539 |
| 2013/0256772 A1* | 10/2013 | Fu ..................... G11C 16/0408 257/298 |
| 2014/0147940 A1* | 5/2014 | Visokay ............ H01L 27/11507 438/3 |
| 2015/0102337 A1* | 4/2015 | Lou ..................... H01L 27/124 257/43 |
| 2017/0040317 A1* | 2/2017 | Tegen ................ H01L 27/0883 |
| 2018/0180921 A1* | 6/2018 | Lu ...................... G02F 1/13394 |
| 2018/0188553 A1* | 7/2018 | Elsinger ............... G02B 5/1809 |
| 2018/0335917 A1* | 11/2018 | Zhao ................... G02F 1/13394 |
| 2019/0079395 A1* | 3/2019 | Ishii ....................... G02B 5/00 |
| 2019/0129298 A1* | 5/2019 | Sherwin .................... G03F 1/44 |
| 2019/0198467 A1* | 6/2019 | Tanaka ............... H01L 21/4846 |
| 2019/0324176 A1* | 10/2019 | Colburn .............. G02B 5/1852 |
| 2019/0369439 A1* | 12/2019 | Li ....................... G02F 1/1335 |

FOREIGN PATENT DOCUMENTS

| | | |
|---|---|---|
| JP | H10319569 A | 12/1998 |
| JP | 2001005197 A | 1/2001 |
| JP | 2001272764 A | 10/2001 |
| JP | 2002189280 A | 7/2002 |
| JP | 2002189281 A | 7/2002 |
| JP | 2003322949 A | 11/2003 |
| JP | 2007178649 A | 7/2007 |
| JP | 2007188069 A | 7/2007 |
| JP | 2007249198 A | 9/2007 |
| JP | 2011215614 A | 10/2011 |

* cited by examiner

METHOD AND DEVICE FOR PATTERNING THICK LAYERS

TECHNICAL FIELD

The present application relates in general to semiconductor fabrication, and in particular, to a method and device for patterning thick layers.

BACKGROUND

In many applications, for example industrial applications, it is desirable to have electrical isolation between low voltages of controllers and high voltage of motors or other equipment. Isolation breaks the direct connection paths between the signal domains and breaks the common ground loop. Integrated capacitors on a semiconductor substrate may be used for isolation. Some methods for manufacturing integrated isolation capacitors on a semiconductor substrate involve patterning and etching uncommonly thick dielectric layers that can present significant challenges to photolithographic processing.

SUMMARY

An embodiment method of fabricating an integrated circuit includes applying photoresist to a MESA dielectric layer of a semiconductor structure, to generate a photoresist layer. The method also includes exposing the photoresist layer with a grayscale mask, to generate an exposed photoresist layer. The exposed photoresist layer includes a thick photoresist pattern in a first region, a thin photoresist pattern in a second region where a height of the thin photoresist pattern is less than half a height of the thick photoresist pattern, and a gap region between the thick photoresist pattern and the thin photoresist pattern.

An embodiment semiconductor structure includes a semiconductor substrate and a MESA dielectric layer overlying the semiconductor substrate. The MESA dielectric layer includes a MESA capacitor dielectric in a capacitor region of the semiconductor structure, the MESA capacitor dielectric having a first height and a MESA graybox in a scribe lane of the semiconductor structure, the MESA graybox having a second height, where the second height of the MESA graybox is less than half of the first height of the MESA capacitor dielectric. Additionally, the MESA dielectric layer includes a thin dielectric layer between the MESA capacitor dielectric and the MESA graybox, the thin dielectric layer having a third height, where the third height of the thin dielectric layer is less than the second height of the MESA graybox.

An embodiment method of fabricating an integrated circuit includes imaging a MESA alignment mark on a structure, where the MESA alignment mark includes a MESA graybox of a MESA dielectric layer, where a height of the MESA graybox is less than half of a height of a MESA capacitor dielectric of the MESA dielectric layer. Additionally, the method includes imaging a metal layer, while imaging the MESA alignment mark, where the metal layer is beneath the MESA alignment mark and determining whether the MESA alignment mark is aligned with the metal layer, based on imaging the MESA alignment mark and imaging the metal layer.

DETAILED DESCRIPTION

Integrated capacitors, such as high voltage or extra-high voltage integrated capacitors may be useful for isolation. Multiple capacitors in parallel have a higher capacitance, at the expense of a large area. For an ideal parallel plate capacitor, the breakdown voltage is given by:

$$V_{bd} = E_{ds} d,$$

where $V_{bd}$ is the breakdown voltage of the capacitor, $E_{ds}$ is the dielectric strength of the capacitor, and d is the distance between the plates of the capacitor. In a semiconductor structure with two metal layers forming capacitor plates, the breakdown voltage increases as the thickness of the dielectric layer between the metal plates increases. However, very thick dielectric layers may lead to wafer bowing or warpage, which may lead to wafers breaking in tools or on handlers. Also, the high aspect ratio of vias connecting metal layers separated by thick dielectrics increases wafer processing complexity significantly.

In some examples, thick dielectric layers are achieved by alternating metal and inter-layer dielectric (ILD) loops and vias to provide interconnection between the levels. However, this adds significant cost to the manufacturing process.

High or very high voltage capacitors, for example supporting isolation greater than 4 kVrms, for example 4-10 kVrms, have thick dielectric layer with a thickness of greater than 5 µm, for example a thickness of greater than 8 µm.

Figure 1:
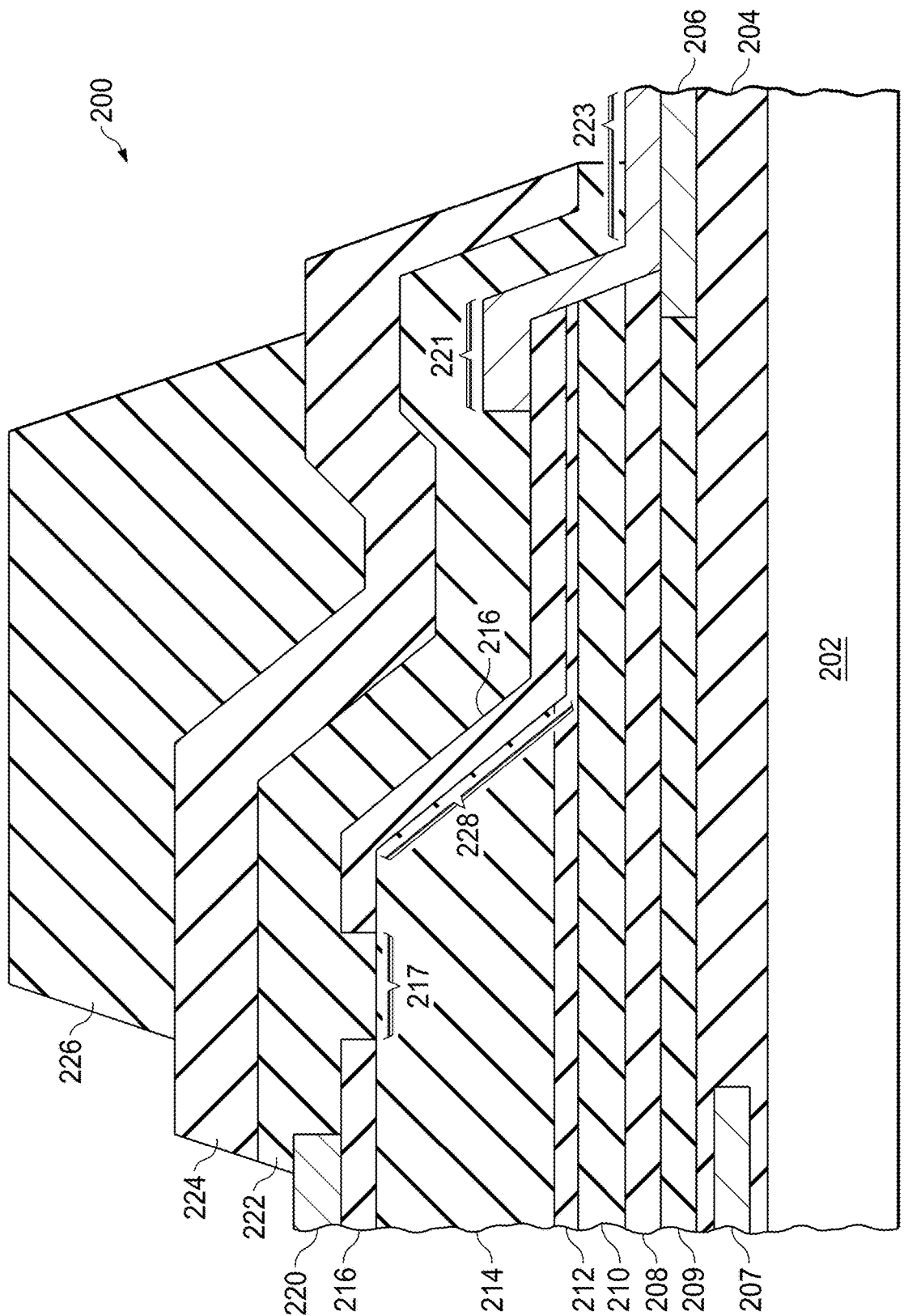
FIG. 1 illustrates a cross sectional view of an example portion of a semiconductor structure with a MESA structure.

In an example, a fabrication technique utilizes a thick dielectric layer, referred to as a MESA layer, on the top surface of a semiconductor wafer. Because the thick dielectric layer is only present in regions containing high voltage capacitors, and it is above the surface of the substrate and has a flat upper surface, it is mesa shaped, and may be referred to as a MESA dielectric. FIG. 1 illustrates a cross-sectional view of the semiconductor structure 200 containing a MESA dielectric. The semiconductor structure 200 includes the semiconductor substrate 202. The processing layers 204 may include various devices and interconnections of the devices that are deposited on the semiconductor substrate 202. Examples of devices in the processing layers 204 include metal-oxide semiconductor (MOS) transistors, bipolar transistors, field effect transistors (FETs), diodes, resistors, inductors, and capacitors. The devices may be interconnected using metal layers isolated by inter-metal dielectric layers. Additionally, the metal layer 206, on the processing layers 204, is formed for connections between the underlying devices and bond pads that provide external connections. In an embodiment, the system forms a bottom capacitor plate 207 for a high voltage capacitor in one of the processing layers 204. The metal layer 206 may contain aluminum, copper, or copper alloys, where the copper or copper alloys may be incorporated by single or dual damascene integration. An ILD oxide layer 209 for the metal layer 206 is disposed on the processing layers 204. The ILD oxide layer 209 may be formed by a tetraethyl orthosilicate (TEOS) process or by a high-density plasma (HDP) process.

In an embodiment, the system forms a migration barrier 208 on the metal layer 206. The migration barrier 208, which may be composed of silicon nitride, SiCN, or other dielectric layers, is from about 800 Å to about 1100 Å. The sub-etch stop silicon dioxide layer 210 on the migration barrier 208 may be referred to as the sub-etch stop layer. In some embodiments, the sub-etch stop silicon dioxide layer 210 is about 0.25 µm to 4.5 µm, for example 0.5 µm. In an embodiment, the bottom of the sub-etch stop silicon dioxide layer 210 is about 6 µm above the top of the semiconductor substrate 202. The etch stop layer (ESL) 212, which the system deposits over the sub-etch stop silicon dioxide layer 210, may be composed of SiON or another dielectric that is different than the MESA dielectric layer. The MESA dielectric etch process has a slower etch rate through the ESL 212 than through the MESA dielectric layer 214.

The system deposits the MESA dielectric layer 214, a thick oxide layer, for example formed using a tetraethyl orthosilicate (TEOS) process, on the ESL 212. The thickest portion of the MESA dielectric layer 214 may be from about 5 µm to about 20 µm thick, for example 8 µm thick. A thicker MESA dielectric layer provides a higher breakdown voltage for the embedded high voltage or extra high voltage capacitor, along with a higher risk of wafer warpage. The system may apply the MESA dielectric layer 214 as thinner layers in a sequence of deposition steps with dissimilar intrinsic stress levels to reduce wafer warpage. The slope of the MESA dielectric layer 214 in the MESA transition region 228 is formed to have a gradual slope using a grayscale mask. The grayscale mask is fully chromed over the area above the MESA, fully clear where there is no MESA material, and gradually transitioned using a dithered area from being fully chromed to fully clear. In one example, the slope is from about 5 degrees to about 30 degrees, for example from about 5 degrees to about 6 degrees. In another example, the slope is about 14 degrees, and the length of the transition is about 17 µm. In an example, the MESA formed by the MESA dielectric layer 214 has a plateau that is about 200 µm by 600 µm. In an embodiment, the MESA layer is formed by a process using example alignment marks, for example a MESA graybox formed in a scribe lane.

The system forms the dielectric layer 216 over the MESA dielectric layer 214. In some embodiments, the dielectric layer 216 is not present. The system forms the dielectric layer 216 by one or more sub-layers, for example a silicon nitride layer, or a silicon oxide nitride (oxynitride) layer and a silicon nitride layer. An opening in the dielectric layer 216 forms an open space laterally from the top plate conductor, reducing leakage current between the top plate conductor and nearby metal features when a high voltage is applied. The dielectric layer 216 conforms to the surface of the MESA dielectric layer 214, and maintains the slope of the MESA transition region 228. The system etches the MESA dielectric layer 214 and the ESL 212, forming the MESA structure. Then, the system deposits the dielectric layer 216. Next, the system etches the dielectric layer 216, the sub-etch stop silicon dioxide layer 210, and the migration barrier 208, to reach the metal layer 206 to form the lower level bond pads.

The system deposits a metal layer over the dielectric layer 216 and over the metal layer 206. The metal layer may have at least two sub-layers, including a refractory metal barrier, layer such as TiN, TiW, or TaN, and another layer, such as aluminum, aluminum-alloy, copper, copper-alloy, or gold. In one embodiment, the metal layer is composed of an aluminum-copper alloy of thickness of between about 700 nm and about 1200 nm, and a TaN barrier metal of thickness between about 10 nm and about 50 nm. The system patterns the metal layer to form a top capacitor plate 220 on top of the thick portion, or plateau, of the MESA dielectric layer 214, the conductive leads 221 on the recessed portion of the MESA dielectric layer 214, and a bond pad conductor in the openings of the MESA dielectric layer 214.

The system patterns and etches the layer 216, to form a space 217. In an example, the space 217 may be between about 5 µm and about 15 µm.

The system deposits the first layer of protective overcoat layer 222, which may be composed of silicon dioxide, on the wafer over the top capacitor plate 220, the conductive leads 221, the bond pad conductor 223, the dielectric layer 216, and the MESA dielectric layer 214. The first layer of protective overcoat layer 222 may be from about 0.8 µm to about 2.2 µm thick, for example 1.6 µm thick. The first protective overcoat layer may be composed of about 1.3 µm oxide, for example formed by an HDP process, and about 0.3 µm of another oxide layer, for example formed by a plasma tetraethyl orthosilicate (PTEOS) process. The system deposits the second protective overcoat layer 224, which may be composed of silicon oxynitride, on the protective overcoat layer 222. In one embodiment, the second protective overcoat layer 224 is about 3 µm thick. The protective overcoat layer 222 and the second protective overcoat layer 224 remain as conformal coating layers without planarization. The system etches the protective overcoat layer 222 and the second protective overcoat layer 224, to expose a portion of the top capacitor plate 220 and a portion of the bond pad conductor 223, forming bond pads or other terminal contacts. In one embodiment, the difference in height from the top capacitor plate 220 and the bond pad conductor 223 is about 11 µm.

The system deposits the top polyimide layer 226 on the second protective overcoat layer 224, forming a high voltage capacitor between the top capacitor plate 220 and the bottom capacitor plate 207. Because the system deposits the top polyimide layer 226 in liquid form, surface tension drives a planarizing effect over the underlying topographic surface. The top polyimide layer 226 may be about 20 µm thick over the MESA and up to about 30 µm thick away from the MESA.

Figure 2:
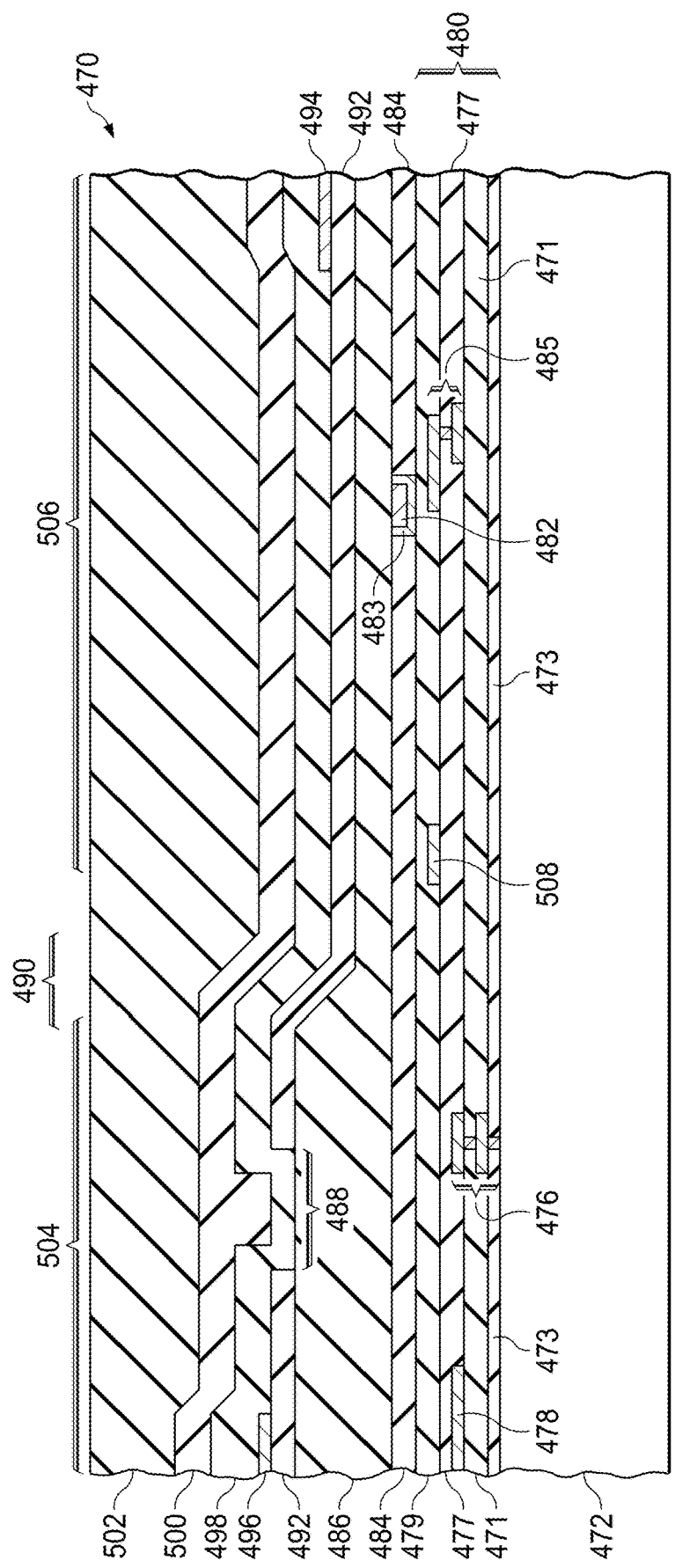
FIG. 2 illustrates a cross sectional view of another example portion of a semiconductor structure with a MESA structure.

FIG. 2 illustrates a cross sectional view for the semiconductor structure 470, with a portion of the high voltage or extra high voltage capacitor arrangement using a MESA dielectric structure. The semiconductor structure 470 includes at least one thick MESA area 504, which contains at least one high voltage capacitor, the thin MESA area 506 containing the high voltage capacitor ground rings, and the MESA transition region 490, which transitions from the thick MESA area 504 to the thin MESA area 506. The substrate 472 is composed of a semiconductor material, such as silicon, but which could alternately consist of other substrates, such as $SiO_2$, silicon on insulator (SOI), or germanium.

The ILD layers 480, which are disposed on the substrate 472, may have a combined thickness of between about 4 µm and about 9 µm thick, for example from 6 µm to 7 µm thick. The ILD layers 480 include the first ILD layer 471, the second ILD layer 477, and the third ILD layer 479. The bottom plate 478 is in the second ILD layer 477 at the second level metal (MET2) layer, above the substrate 472, in the first level metal (MET1) layer, or in the third level metal (MET3) layer. The ILD layers 480 provide isolation and structural support for metal and via features 485, which are used for connecting circuits throughout semiconductor structure 470. The bottom plate 478 is at a potential that is within a few volts of the substrate 472. The Faraday cage 476 is formed in a MET1 layer in the first ILD layer 471 and in a MET2 layer in the second ILD layer 477. The MET1 layer and the MET2 layer are coupled and grounded to the substrate 472 through the first ILD layer 471 and the pre-metal dielectric (PMD) layer 473, to form the Faraday cage 476. The Faraday cage 476, which may be from about 20 µm to about 60 µm from the edge of the bottom plate 478, for example about 40 µm from the edge of the bottom plate 478, is contained within the thick MESA area 504. The Faraday cage 476 surrounds the capacitor as a ring and provides shielding and a charge dissipation path to ground for charges that may be in the ILD layers near the high voltage capacitor. Also, in the third ILD layer 479 is the MET3 508, which is in the thin MESA area 506 about 70 µm from the thick MESA area 504. The MET3 508 is used as a ground ring to circumscribe the high voltage capacitors, and for wiring circuits within the thin MESA area 506.

The copper layer 482 lies in the thin MESA area 506, and extends through the intra-metal dielectric oxide layer 484. The copper layer 482 may be formed, for example, by a damascene copper process. In an embodiment, a migration barrier 483 is disposed between the copper layer 482 and the intra-metal dielectric oxide layer 484. The migration barrier 483, which may be composed of silicon nitride, SiCN, or another dielectric layer, is from about 800 Å thick to about 1100 Å thick. The intra-metal dielectric oxide layer 484 may be about 3 µm thick. The copper layer 482 lies about 100 µm laterally from the thick MESA area 504.

The MESA dielectric layer 486 is disposed on the intra-metal dielectric oxide layer 484. The MESA dielectric layer 486 is thick in the thick MESA area 504, containing the top plate 496, and thin in the thin MESA area 506, containing the high voltage capacitor ground rings 508 and 482, as well as other circuitry and bond pads external to the high voltage capacitor. The MESA dielectric layer 486 gradually transitions from thick to thin in the MESA transition region 490. In an embodiment, the MESA dielectric structure is formed by placing alignment marks in the scribe lines. In some embodiments, the alignment marks are MESA grayboxes. In an example, the slope of the MESA dielectric layer 486 in the MESA transition region 490 is about 14 degrees, with a transition width of about 17 µm. In an embodiment, the transition width is less than 30 µm. The dielectric layer 492, which may be a bilayer containing silicon oxynitride, is formed over the MESA dielectric layer 486. The dielectric layer 492 has an opening 488 that fully circumscribes the top plate 496. The top plate 496 lies on the dielectric layer 492. In an example, the vertical spacing between the top plate 496 and the bottom plate 478 is about 15 µm. The top metal ground ring 494 is also disposed on the dielectric layer 492 in the thin MESA area 506. The top metal ground ring 494 connects directly to a grounded bond pad.

The system deposits the protective overcoat layers 498 and 500 over the entire semiconductor structure 470. The top polyimide layer 502 is disposed over the protective overcoat layer 500. The protective overcoat layer 498, a non-planarized oxide protective overcoat, is about 1.6 µm thick, and may be composed of a bilayer of a 1.3 µm oxide layer, for example formed by an HDP process, and 0.3 µm oxide layer, for example formed by a PTEOS process. The protective overcoat layer 500 is about 2.8 µm of non-planarized SiON. In an example, the top polyimide layer 502 is about 20 µm in the thick MESA area 504 and about 30 µm in the thin MESA area 506.

Figure 3A:
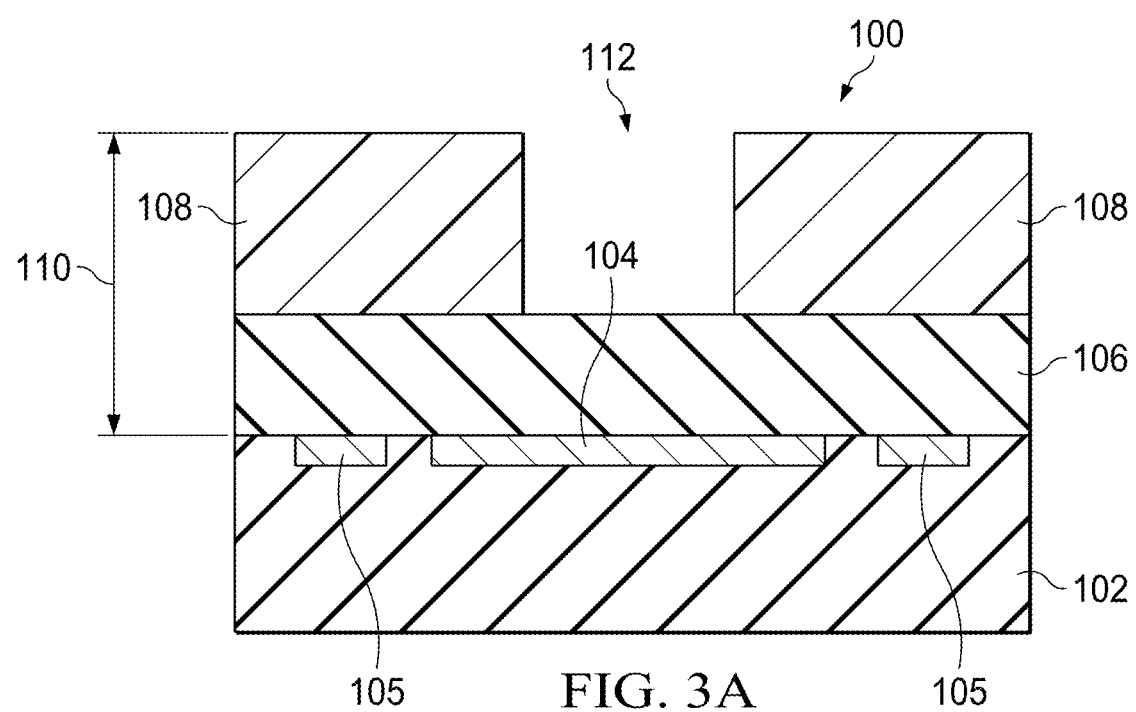
FIGS. 3A-B illustrate examples of thick photoresist layers over a thick oxide layer.
Figure 3B:
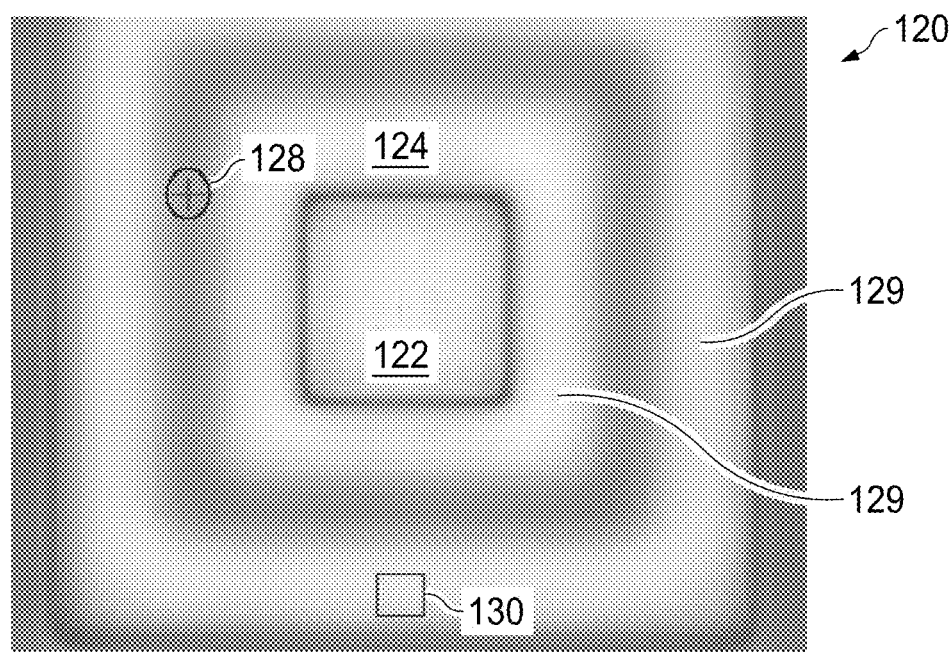

In an example, the system selectively removes the thick dielectric films, such the MESA dielectric layer 214 and the MESA dielectric layer 486, using a photoresist pattern in thick photoresist. FIGS. 3A-B illustrate a cross-sectional view and a top view of thick photoresist layers being used to pattern a thick dielectric material.

FIG. 3A illustrates the cross-section view 100 of the full height photoresist 108 over the thick dielectric layer 106 (not to scale). The previous layers 102, which may contain the underlying metal features 104 and 105, as well as additional devices, lies below the thick dielectric layer 106. The full height photoresist 108, which contains the opening 112 created by exposing the photoresist using a mask, is disposed on the thick dielectric layer 106. The full height photoresist 108 may have a thickness of between about 2.5 µm and about 4.6 µm, for example about 3 µm, and the thick dielectric layer 106 may have a height of between about 5 µm and about 20 µm, for example about 8 µm. There is a distance 110, which is at least 7.5 µm, for example 11 µm, between the top of the full height photoresist 108 and the top of the previous layers 102. Due to the distance 110 exceeding the depth-of-focus for many optical measurement systems, it is difficult to simultaneously image the top of the full height photoresist 108 and the underlying metal features 104, for determining proper alignment.

FIG. 3B illustrates the top view 120, obtained using optical imaging of thick photoresist layers over a thick dielectric region. The thick photoresist layer 124 surrounds the opening 122. The lower metal features 129 are out of focus when the thick photoresist layer 124 is in focus. The alignment marker 128 is over a space between the lower metal features 129, and the alignment marker 130 is over the metal features 129.

The difficulty in simultaneously focusing on the thick photoresist layer and the underlying metal layer can make alignment problematic. As can be seen by the top view with thick photoresist layer 124, the top of the thick photoresist and the bottom features cannot be in focus simultaneously, because the height difference exceeds the depth-of-focus for this optical system. It is desirable to determine that the photoresist pattern is properly aligned to the lower features before performing etching so that the final structure will be properly aligned. However, due to the thickness of the dielectric, combined with the thickness of the photoresist, the photoresist pattern may be out of focus with the structures below. Improper alignment of the patterned thick photoresist to the underlying structures may degrade yield, reliability, and performance.

In an embodiment, an alignment mark in the MESA dielectric region in the scribe region has a height that is lower than the height of the MESA structure. The alignment mark may be used to fabricate the MESA dielectric layer 214 in the semiconductor structure 200 in FIG. 1 or the MESA dielectric layer 486 the semiconductor structure 470 in FIG. 2. For example, the height of the alignment mark is less than half of the height of the MESA. The lower height of the dielectric mark facilitates simultaneous imaging of the alignment mark and metal features below the MESA dielectric layer. Additionally, a lower alignment mark has a reduced risk of breakage during wafer fabrication processing compared to a higher alignment mark. In an embodiment, an alignment mark in a MESA dielectric layer contains an outer MESA graybox and an inner MESA graybox inside the outer MESA graybox, where the inner MESA graybox results in a lower oxide height than the outer MESA graybox, and both the inner MESA graybox and the outer MESA graybox have oxide heights lower than the height of the MESA structure. An example alignment mark has a copper frame beneath the outer MESA graybox. In an embodiment, a photoresist layer for producing an alignment mark is selectively thinned, so the resist has different thicknesses, to produce different portions of the alignment mark. A lower height photoresist layer is more easily imaged simultaneously with underlying features than a full height photoresist layer. Additionally, the lower height photoresist feature layer may be transferred to a thick dielectric layer during the subsequent etch process which, after fully consuming the thinner resist layer, will partially etch the thick dielectric layer, reducing the height of the thick dielectric layer.

Figure 4A:
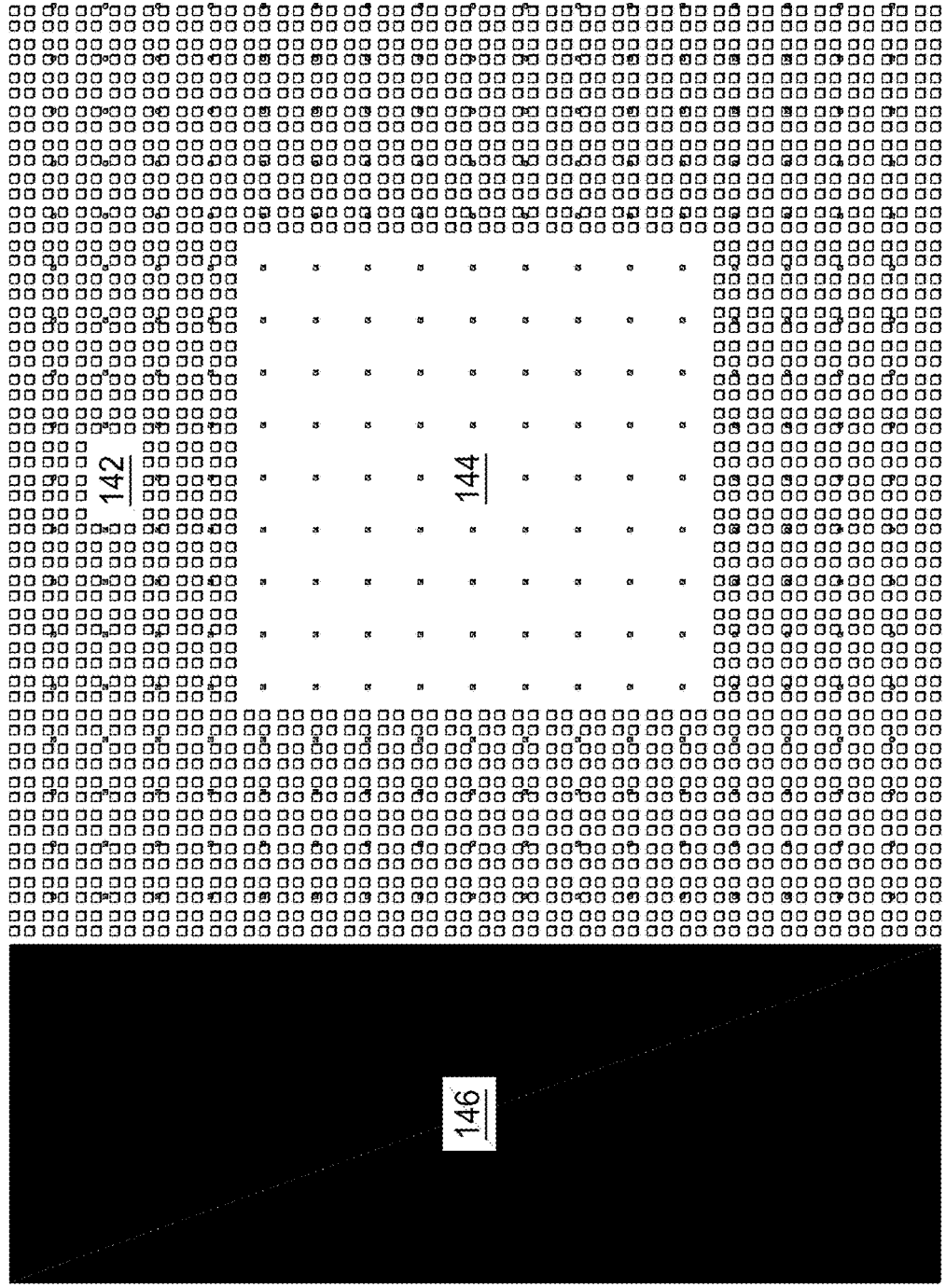
FIGS. 4A-E illustrate examples of using a grayscale mask to generate a thin photoresist layer over a thick oxide layer.

FIGS. 4A-E illustrate the use of a grayscale mask, also known as a dithered mask, for forming a photoresist layer with thinner regions in some locations, for example over lower metal features. A thin photoresist layer may improve imaging of lower metal features to improve alignment. FIG. 4A illustrates the grayscale mask 140, which contains the medium density grayscale pattern 142 in a ring around the low density grayscale region 144. The medium density grayscale pattern 142 and the low density grayscale region 144 are partially chromed in a pattern smaller than the wavelength of the light used for photolithography. The opaque region 146, which is fully chromed, is along one side of the medium density grayscale pattern 142.

Figure 4B:
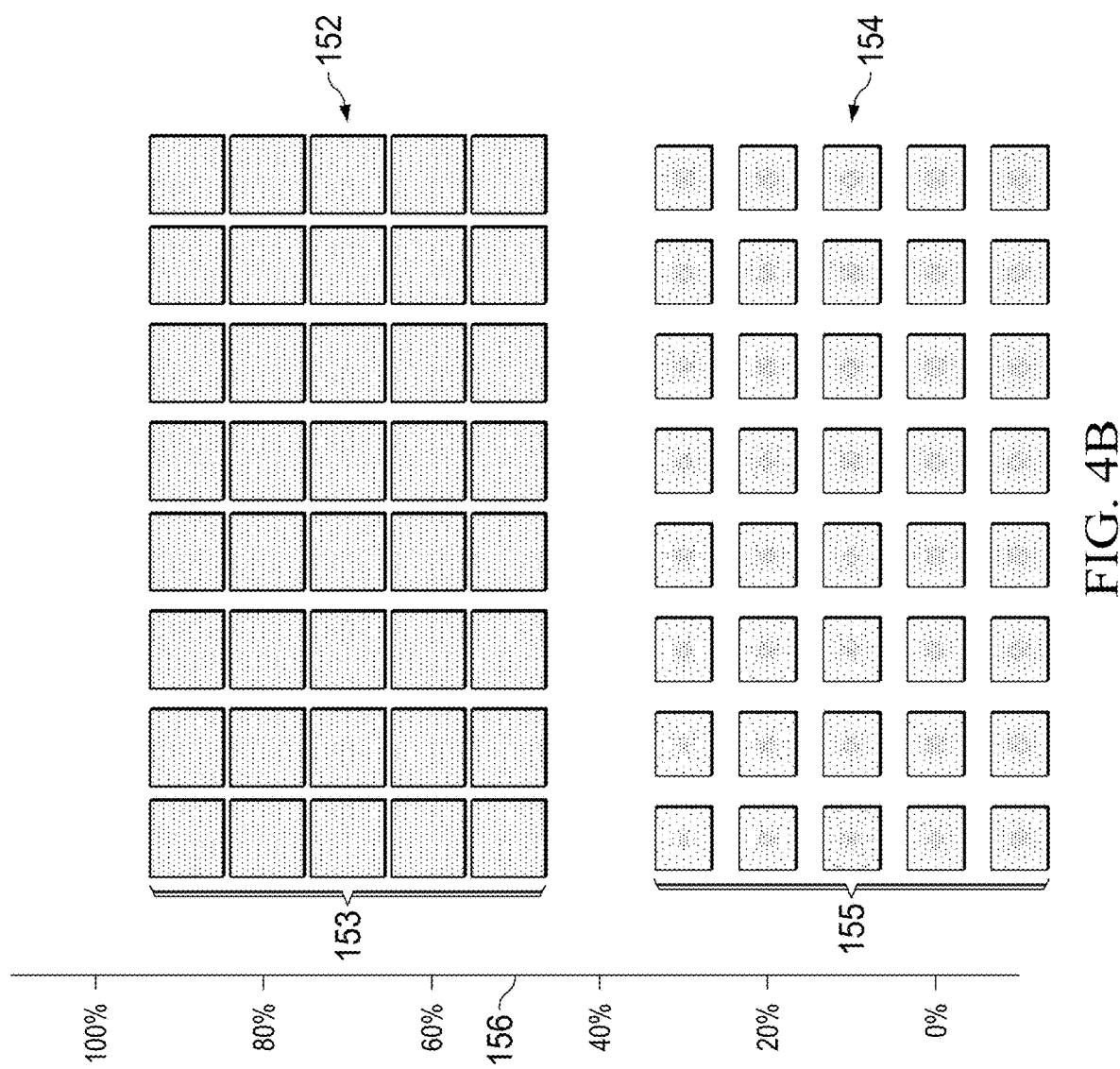

FIG. 4B illustrates the grayscale pattern scale 156, which ranges from 0% grayscale (totally clear) to 100% grayscale (totally opaque). The pattern 152 depicts a higher density grayscale pattern with opacity 153, and the pattern 154 depicts a lower density grayscale pattern with opacity 155. Pattern 152 and pattern 154 are partially opaque and partially transparent. The value 100% corresponds to a fully opaque region, the value 0% refers to a fully transparent region, and intermediate values refer to partially opaque and partially transparent regions. The grayscale pattern includes sub-resolution features that are not directly translated into the photoresist during the photolithographic process using the grayscale mask. The grayscale pattern operates by diffusing the light and reflecting some of the light, so less than all of the light passes through the dithered region.

Figure 4C:
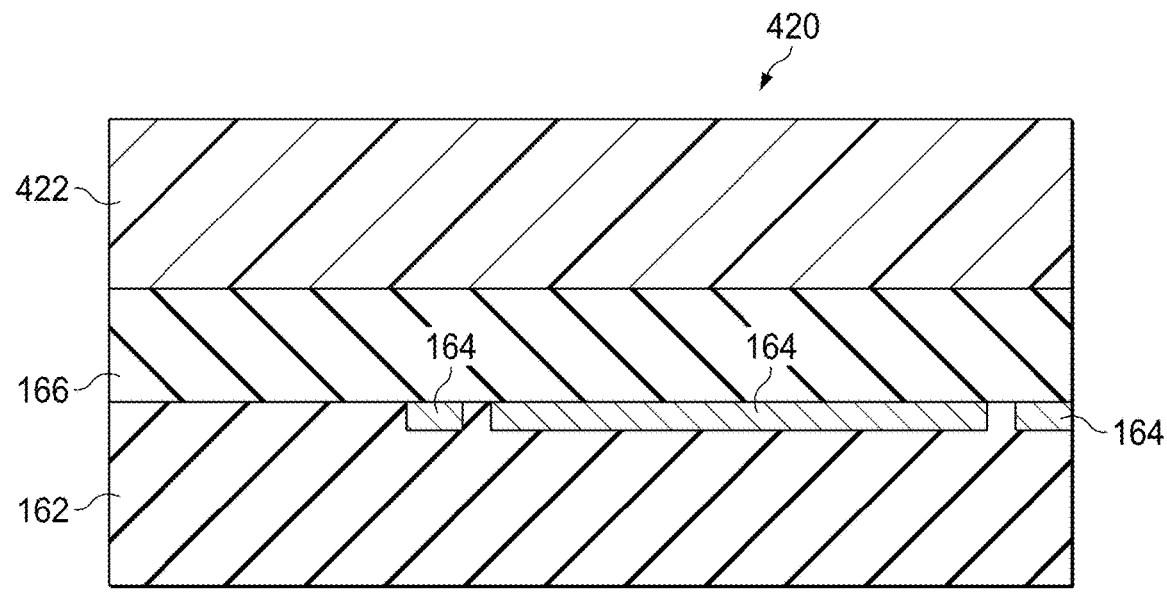

FIG. 4C illustrates the cross sectional view of the semiconductor structure 420 with a thick photoresist layer 422 over a thick dielectric layer 166. The thick dielectric layer 166 is disposed on the previous layers 162. Also, the previous layers 162 contain the metal features 164.

Figure 4D:
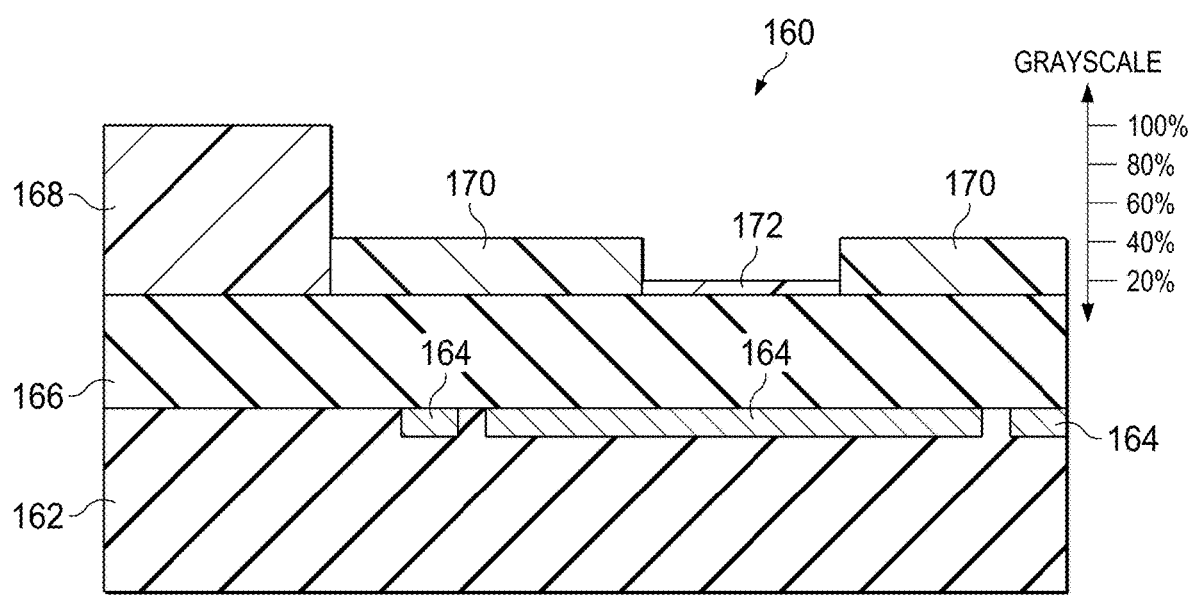

Lithography is performed on the semiconductor structure 420 using a grayscale mask, for example the grayscale mask 140 illustrated in FIG. 4A, to form a multi-tiered photoresist layer over the alignment structure 160, as illustrated in FIG. 4D. The thick portion of the photoresist layer 168 is below the opaque region 146 of the grayscale mask 140, and is not exposed. The medium height portion of the photoresist layer 170 is in the area below the medium density grayscale pattern 142 of the grayscale mask 140, and is partially exposed. Also, the low height portion of the photoresist layer 172 is below the low density grayscale region 144 of the grayscale mask 140, and is mostly, but not fully, exposed.

Figure 4E:
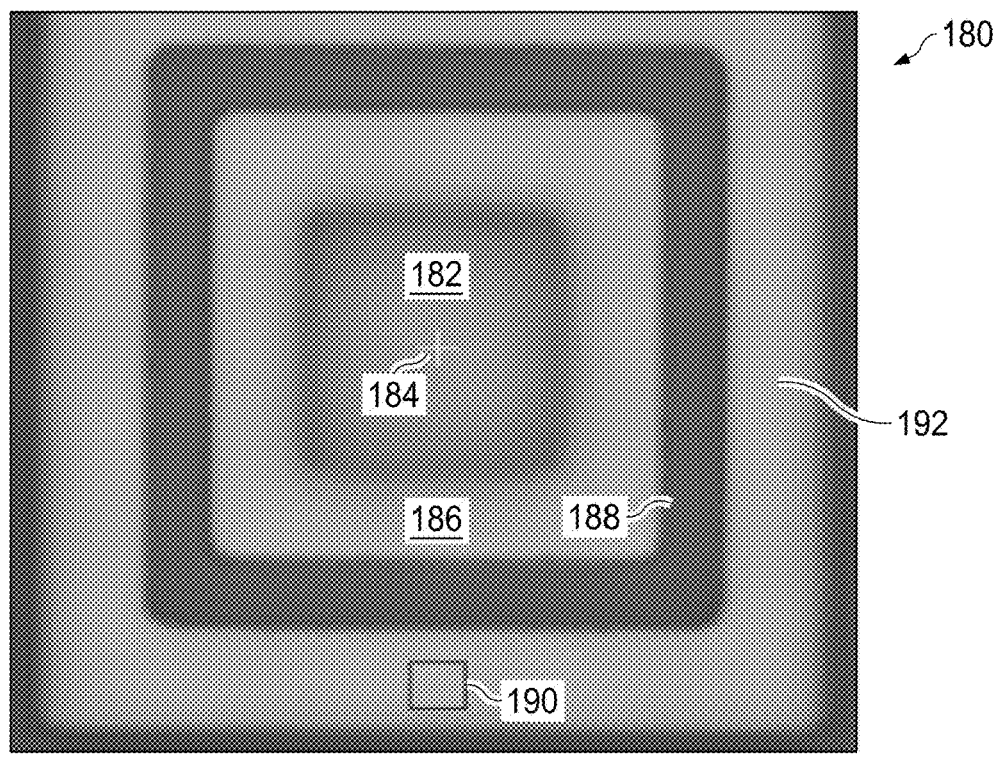

FIG. 4E illustrates an alignment structure 180, a top view of the alignment structure 160. Region 182 contains a thin level of photoresist, corresponding to the low height portion of the photoresist layer 172. Regions under 182, 186, and 192 represent metal features 164 of FIG. 4D. The boundary between the region 182 with a thin level of photoresist and the region 186 with a moderate level of photoresist is simultaneously visible with the lower metal features in the regions 186 and 192. The mark 184 is the center target of the imaging system, and is in the region 182 of FIG. 4E. Also, the box mark 190 is over the metal frame region 192.

Figure 5A:
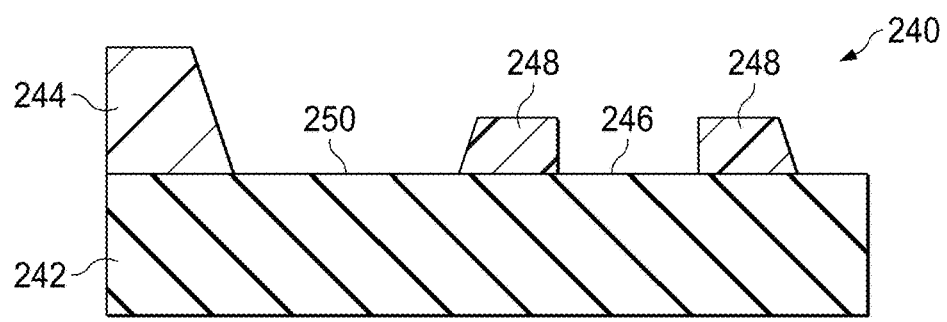
FIGS. 5A-B illustrate an example transfer of a variable height photoresist layer into a dielectric layer.
Figure 5B:
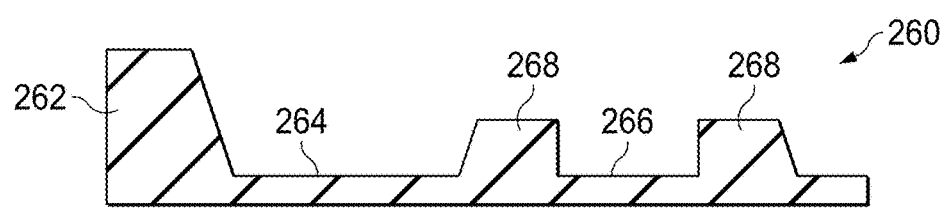

FIGS. 5A-B illustrates the transfer of a photoresist pattern, produced using a grayscale mask, to an underlying dielectric layer, for example a thick dielectric layer. FIG. 5A illustrates a cross sectional view of the semiconductor structure 240 with a photoresist pattern on a thick dielectric layer 242. The semiconductor structure 240 may be used to fabricate the MESA dielectric layer 214 in the semiconductor structure 200 in FIG. 1 or the MESA dielectric layer 486 in the semiconductor structure 470 in FIG. 2. Below the thick dielectric layer 242 may be a substrate and additional circuitry (not pictured). The photoresist pattern is generated using a grayscale mask. Disposed on the thick dielectric layer 242 is the full height photoresist region 244, created by an opaque region of a grayscale mask. The medium height photoresist pattern 248, disposed on the thick dielectric layer 242, is produced by a dithered region of the grayscale mask. The region 246 contains no photoresist, and is within the medium height photoresist pattern 248. The medium height photoresist pattern 248 gradually transitions to the adjacent region 250, which does not contain photoresist, where the transition region is produced by a gradient in the grayscale mask dithering from partially to fully transparent.

After etching the semiconductor structure 240, the cross sectional view of the semiconductor structure 260, in FIG. 5B, is generated. The semiconductor structure 260 may be used to fabricate the MESA dielectric layer 214 in the semiconductor structure 200 in FIG. 1 or the MESA dielectric layer 486 in the semiconductor structure 470 in FIG. 2. A moderate height feature 268, for example an alignment mark, is etched into the thick dielectric layer 242. The transition region between the moderate height feature 268 and the surrounding low height region 264 occurs across a lateral span of about 6 µm to about 8 µm. The low height region 264 lies between the full height feature 262 and the moderate height feature 268. The region 266 is within the moderate height feature 268. In an embodiment, the full height feature 262 is used to form a high voltage capacitor. In an embodiment, the moderate height feature 268 has a height that is between a quarter and a half of the height of the full height feature 262. The reduced thickness of the moderate height feature 268 assists in the optical determination of alignment of the moderate height feature to underlying features, for example to lower metal features, during and after fabrication. Additionally, the thinner dielectric is more robust for subsequent processing. The gradual sloping of the moderate height feature reduces the risk of generating defects during subsequent processing steps.

Figure 6A:
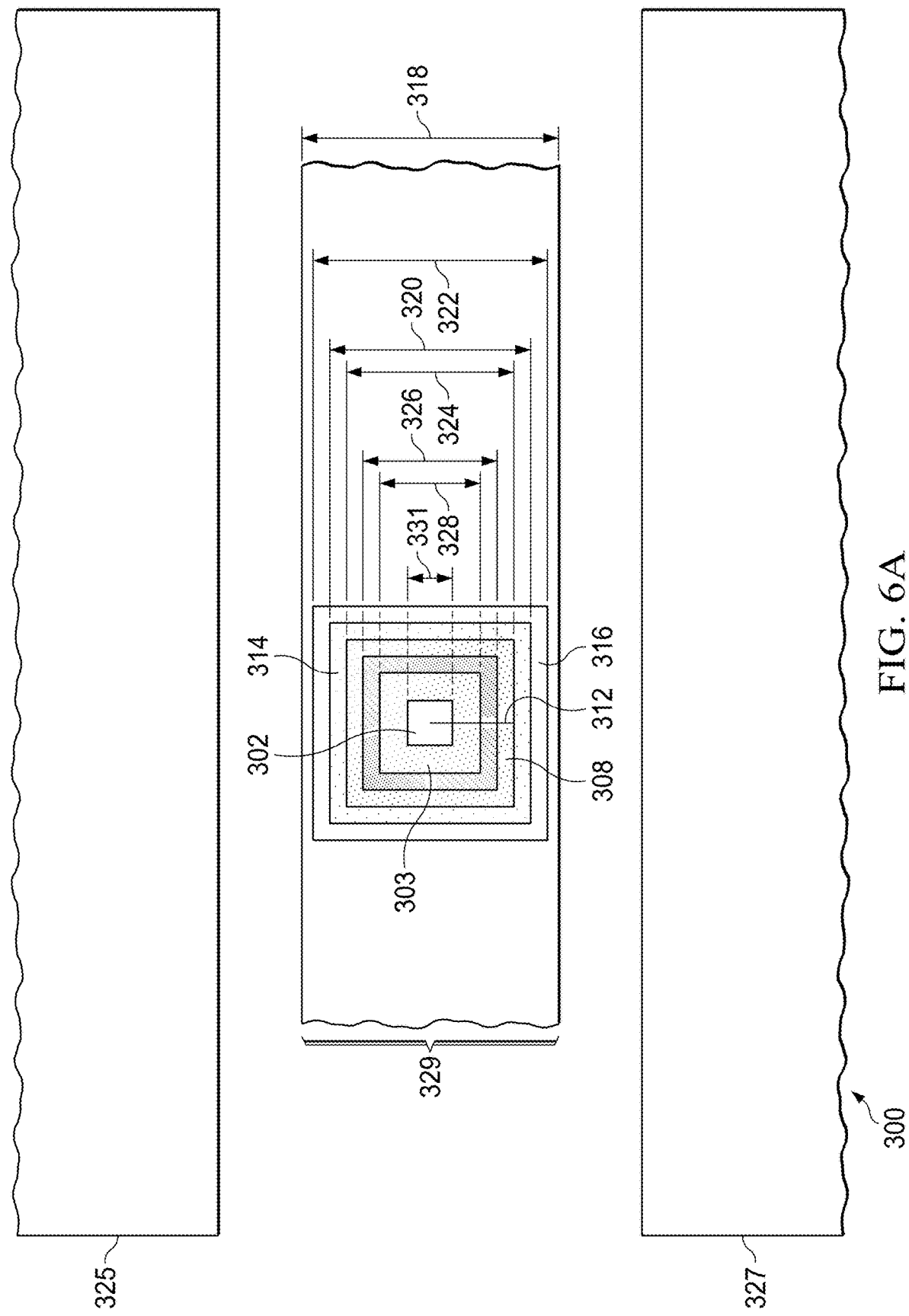
FIGS. 6A-C illustrate an example semiconductor structure with a MESA graybox alignment module.
Figure 6B:
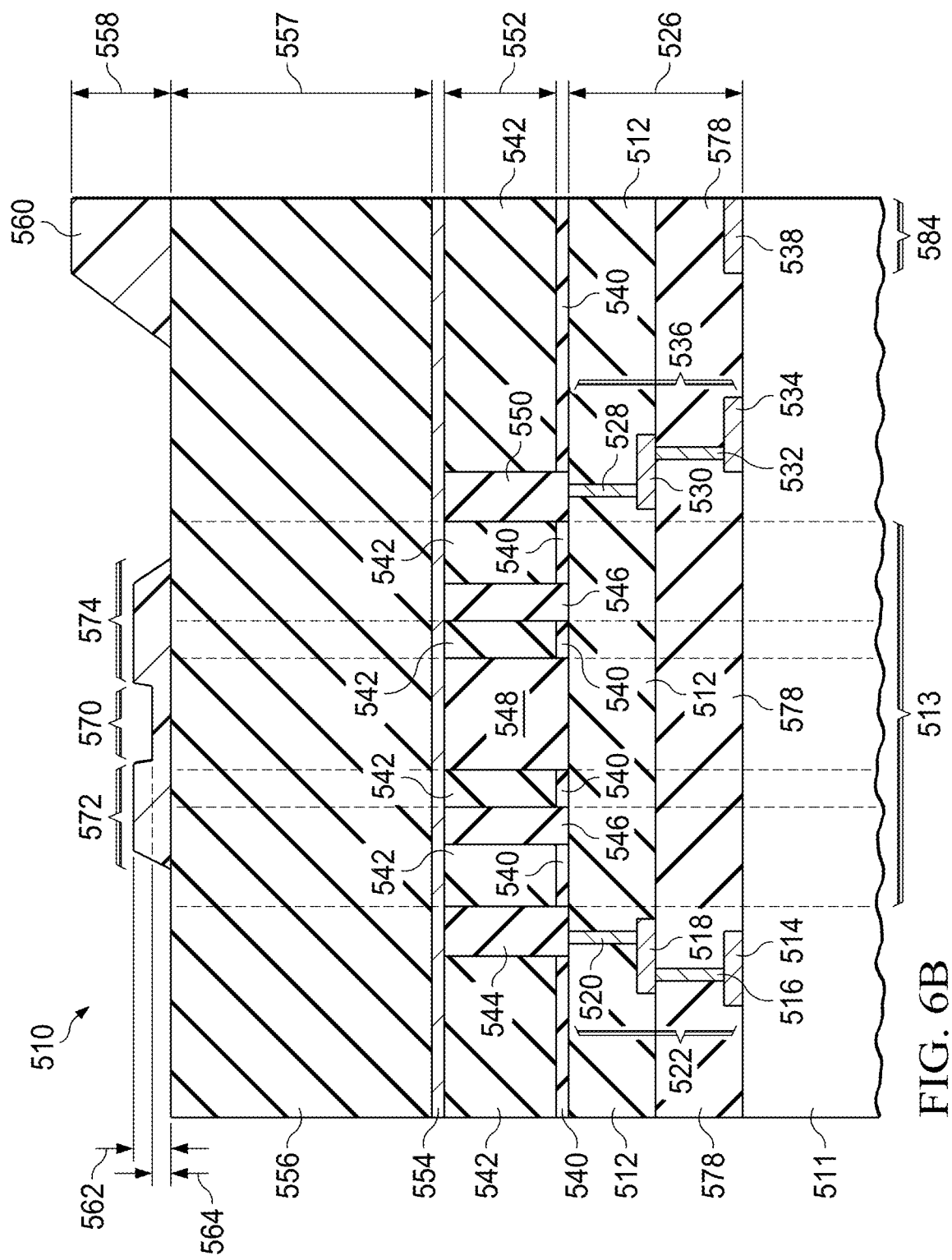
Figure 6C:
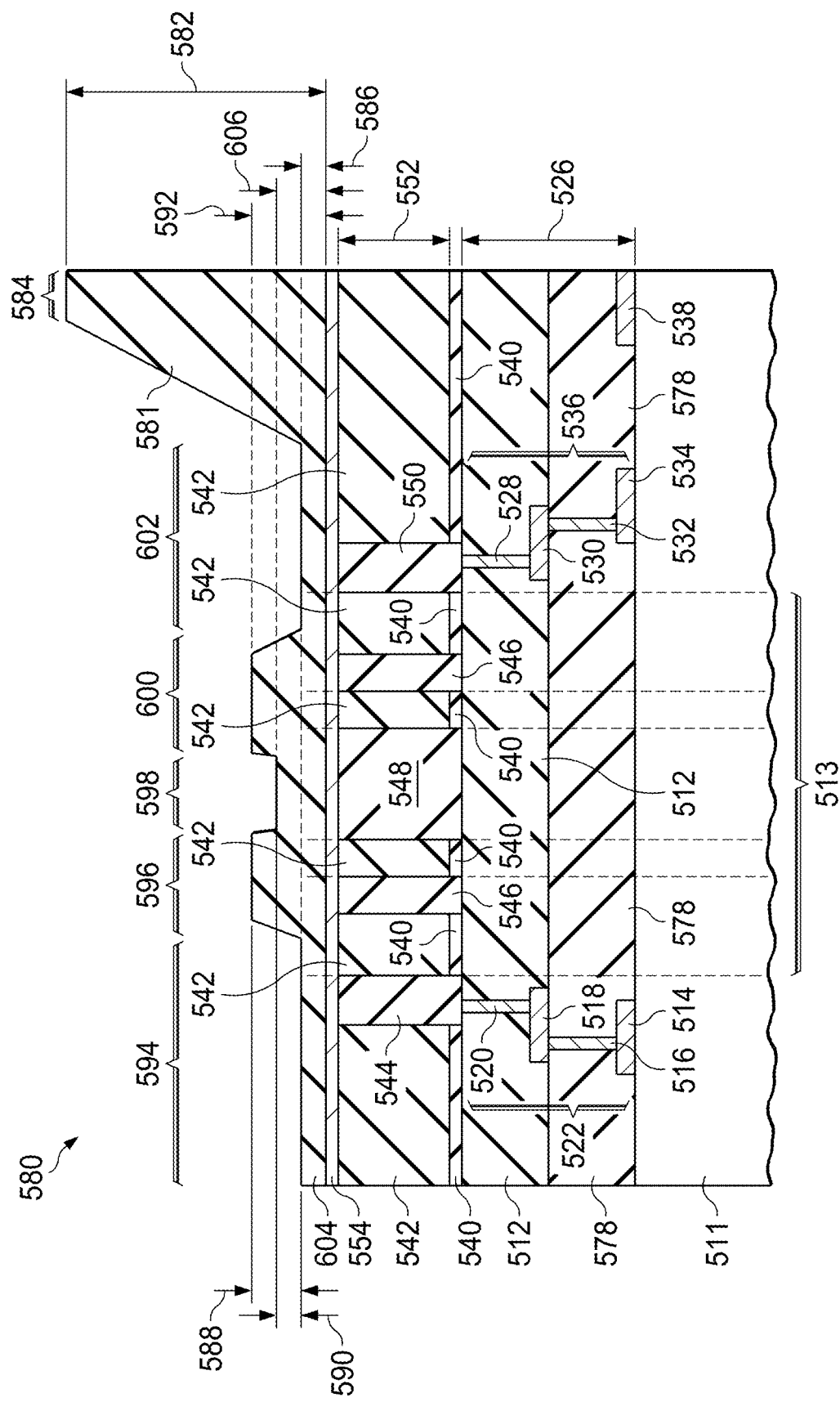

FIGS. 6A-C illustrate a semiconductor structure, with a MESA alignment mark, during and after fabrication. The MESA alignment mark is used to determine alignment of the MESA features to underlying copper features. FIG. 6A illustrates a top view of the semiconductor structure 300, which contains high voltage capacitor regions 325 and 327 and the scribe lane 329. In some examples, the scribe lane 329 is typically destroyed by sawing the wafer to singulate the individual integrated circuits formed in a large array of integrated circuits on a wafer during fabrication. In other examples, for example in integrated circuits with wide scribe lanes, a portion of the scribe lane 329 containing the MESA alignment structure is maintained after sawing the integrated circuits. The high voltage capacitor regions 325 and 327 contain high voltage capacitors with a thick dielectric between the capacitor plates. For example, the high voltage capacitor regions 325 and 327 may contain the semiconductor structure 200 in FIG. 1 or the MESA dielectric layer 486 in the semiconductor structure 470 in FIG. 2. In an embodiment, the scribe lane 329 has a width 318 of about 52 µm.

The scribe lane 329 contains multiple scribe modules used to assist the fabrication processing of semiconductor structure 300, including the MESA alignment module region 316. In an example, the MESA alignment module region 316 has a width 322 of about 48 µm, and may be a 48 µm by 48 µm square. This leaves a 2 µm tolerance on both sides of the MESA alignment module region 316 for the MESA alignment module region 316 to fit within the scribe lane 329. The sloped region 314 transitions from a low height MESA dielectric region to the moderate height of the outer MESA graybox 312. The outer edge of the sloped region 314 has a width 320 of about 42 µm. In an embodiment, the sloped region 314 begins about 3 µm from the module external boundary and has a transition width of between about 6 µm and about 8 µm. The low height MESA dielectric region may have a dielectric thickness of about 1 µm. The outer MESA graybox 312, having an outer width 324 of about 28.4 µm, has a height between the height of the low height MESA dielectric region and the height of the full height MESA region. For example, the outer MESA graybox 312 may have a height of about 2 µm to about 4 µm. The metal layer 308 lies below the outer MESA graybox 312 in the shape of a frame, and has an outer width 324 of about 28.4 µm and an inner width 326 of about 22.4 µm. The metal layer 308 may contain copper or aluminum. Inside the outer MESA graybox 312 is the inner MESA graybox 302, which has a height less than that of the outer MESA graybox 312. In an embodiment, the inner MESA graybox 302 has a width 331 of about 10 µm. In an example, the inner MESA graybox 302 has a height of about 1.75 µm above the low height MESA dielectric region, and a height about 0.25 µm below the height of the outer MESA graybox 312. A copper box 303 of width 328 is below and centered about the inner MESA graybox 302. In some embodiments, the copper box 303 is not present.

FIG. 6B illustrates a cross sectional view of the semiconductor structure 510 during fabrication of a MESA alignment module. The semiconductor structure 510 contains a scribe lane 513 with a width 524 of about 52 µm. The lower portion of the semiconductor structure 510 includes the substrate and lower layers 511. The substrate and lower layers 511 include a substrate, a first ILD oxide layer, MET1, and other features and devices, for example MOS transistors, bipolar transistors, FETs, diodes, resistors, inductors, capacitors, and interconnections. Disposed on the substrate and lower layers 511 is the second ILD oxide layer 578. In the second ILD oxide layer 578 outside of the scribe lane 513 are the MET2 514, the MET2 534, and the MET2 538. The MET2 538 forms a portion of the bottom capacitor plate for a high voltage capacitor in the capacitor region 584. For example, the capacitor region 584 may contain the semiconductor structure 200 in FIG. 1 or the semiconductor structure 470 in FIG. 2. Above the MET2 514 is the via 516, and above the MET2 534 is the via 532. Also, the third ILD oxide layer 512 is above the second ILD oxide layer 578. In an embodiment, the second ILD oxide layer 578 and the third ILD oxide layer 512 combined have a height 526 of about 4.0 µm. Outside of the scribe lane 513, in the third ILD oxide layer 512 are the MET3 518 and the MET3 530. Above the MET3 518 is the via 520, and above the MET3 530 is the via 528. At the top of the third ILD oxide layer 512 is the damascene etch stop layer 212. The metal structure 522 includes the MET2 514, the via 516, the MET3 518, and the via 520. Also, the metal structure 536 includes the MET2 534, the via 532, the MET3 530, and the via 528.

The fourth ILD oxide layer 542, which is above the etch stop layer 540, has a thickness 552 of about 3.0 µm. Outside of the scribe lane 513, in the fourth ILD oxide layer 542, are the copper features 544 and. Inside the scribe lane 513, in the fourth ILD oxide layer 542, are the copper features 546, which form a picture frame shaped region when viewed from a top-down perspective, which surround the copper feature 548. The migration barrier layer 554 is disposed above the copper features 544, 546, and 548 and extends above the fourth ILD oxide layer 542. The MESA dielectric layer 556, which has a thickness 557 of about 8.0 µm, is disposed on the migration barrier layer 554.

A photoresist layer on the MESA dielectric layer is exposed using a grayscale mask. The capacitor photoresist region 560, over the capacitor region 584, is beneath an opaque region of the grayscale mask, and has a thickness 558 of about 3 µm. The system removes regions of the photoresists below transparent regions of the grayscale mask. The system partially removes MESA alignment module photoresist regions 572, 574, and 570 within the scribe lane 513 and below dithered regions of the mask, leading to a thickness of less than the thickness of the capacitor photoresist region 560. The MESA alignment module photoresist regions 572 and 574, which have gradual outward slopes, have a thickness 562 of about 0.9 µm, and are formed from a 30% grayscale mask region. The MESA alignment module photoresist regions 572 and 574 have steep inward slopes to the MESA alignment module photoresist region 570, which is exposed by a 25% grayscale mask, and has a thickness 564 of about 0.75 µm.

FIG. 6C illustrates a cross sectional view of the semiconductor structure 580, which is formed by etching the resist-patterned semiconductor structure 510 in FIG. 6B. The system has etched the MESA dielectric layer 556, and has removed the photoresist layer. In an example, the MESA dielectric layer 604 in the thin MESA dielectric regions 594 and 602 has a thickness 586 of about 1.0 µm. In an example, in the capacitor region 584 outside the scribe lane 513, the MESA dielectric layer 604 forms the MESA capacitor dielectric 581, which has a thickness 582 of about 8.0 µm. In an embodiment, a metal layer on the MESA capacitor dielectric 581, which extends beyond the semiconductor structure 580 shown in FIG. 6C, forms the top capacitor plate for a high voltage capacitor. The MESA dielectric layer 604 gradually transitions from the capacitor region 584 to the thin MESA dielectric region 602. The outer MESA graybox regions 596 and 600 of the MESA dielectric layer 604 gradually transition over a distance of about 8 µm to the thin MESA dielectric regions 594 and 602, respectively. The outer MESA graybox regions 596 and 600 have a MESA dielectric thickness 592 of about 3.0 µm and are a height 588 of about 2.0 µm above the thin MESA dielectric regions 594 and 602. The inner MESA graybox region 598 has a thickness 606 of about 2.75 µm and is a height 590 of about 1.75 µm above the thin MESA dielectric regions 594 and 602. Metal is added over the entire mark as a top metal layer composed of Al. After patterning and etching, the top metal layer may then be measured for alignment to the MESA.

For an embodiment, the inner MESA graybox is lower than the outer MESA graybox. For example, the inner MESA graybox may be five percentage points of the MESA capacitor height lower than the outer MESA height. In another embodiment, the inner MESA graybox is higher than the outer MESA graybox. The Table 1 below illustrates some example heights for the outer MESA graybox and the inner MESA graybox.

TABLE 1

| Inner MESA Graybox Height | Outer MESA Graybox Height | MESA Capacitor Height |
|---|---|---|
| 20% | 25% | 100% |
| 25% | 30% | 100% |
| 30% | 35% | 100% |
| 35% | 40% | 100% |
| 25% | 20% | 100% |
| 35% | 30% | 100% |
| 40% | 35% | 100% |
| 45% | 40% | 100% |

Figure 7:
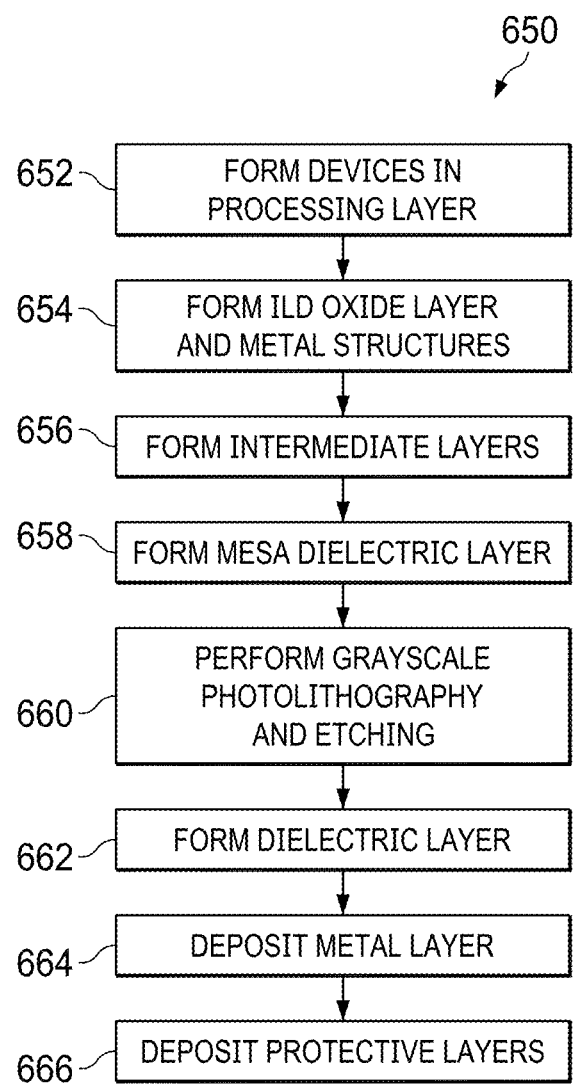
FIG. 7 illustrates a flowchart for an example method of fabricating an integrated circuit.

FIG. 7 illustrates a flowchart 650 for an embodiment method of fabricating an integrated circuit, such as the semiconductor structure 200 illustrated in FIG. 1 or the semiconductor structure 470 illustrated by FIG. 2. In a block 652, a system forms devices in a processing layer on a substrate. The substrate may be composed of a silicon, silicon dioxide, SOI, or germanium. Devices such as MOS transistors, bipolar transistors, FETs, diodes, resistors, inductors, and/or capacitors are formed in the processing layer. Additionally, a system forms metal layers, insulated by inter-metal dielectric layers, to interconnect the devices. In one embodiment, the system forms a bottom capacitor plate for a high voltage capacitor in the processing layers. The metal layers may be aluminum, copper, or a copper alloys, which may be fabricated by subtractive etching, and single or dual damascene integration techniques.

In a block 654, the system forms an ILD oxide layers, including metal structures, on the processing layer. The system may deposit three ILD oxide layers, a first ILD layer, a second ILD layer, and a third ILD layer. The system may form metal structures in the ILD layers. For example, the system may form a bottom plate, for example a copper plate, in one or more of the three ILD layers. Also, the system may form a Faraday cage in one of the ILD layers. The system may form a metal frame structure and a metal plate structure in one or more of the ILD layers, in a scribe lane. The metal frame structure and the metal plate structure may be composed of copper, aluminum, or an aluminum alloy.

In a block 656, the system forms intermediate layers. The system may deposit an intra-metal dielectric oxide layer over an ILD layer. The system may form a metallic migration barrier in an opening of the intra-metal dielectric oxide layer, and form a copper layer, for example by a damascene copper process over the metallic migration barrier. The metallic migration barrier may be composed of Ta, TaN, Ti, or TiN. After the damascene process, the system deposits a migration barrier on a metal layer. This migration barrier, in conjunction with the previously formed metallic migration barrier, fully encapsulates copper to prevent migration into the surrounding dielectrics. The migration barrier may be composed of silicon nitride, SiCN, or another dielectric material. Then, the system forms a sub-etch stop silicon dioxide layer on the migration barrier. Next, the system deposits an ESL layer on the sub-etch stop silicon dioxide layer.

In a block 658, the system forms a thick MESA dielectric layer on the ESL or on another layer. The system may deposit the MESA dielectric layer using a TEOS process.

In a block 660, the system performs grayscale photolithography and etching on the thick MESA dielectric layer. The system may form a thick MESA in capacitor region in the active portion of the wafer. Also, the system forms a MESA graybox alignment mark in the scribe lane in the MESA dielectric layer. The system may align the photoresist alignment mark to metal features in the scribe lane.

In a block 662, the system forms a dielectric layer over the MESA dielectric layer. In some embodiments, the block 662 is not performed. The system forms the dielectric layer by one or more sub-layers, including a silicon oxide nitride layer and a silicon nitride layer. The system forms openings in the dielectric layer.

In a block 664, the system deposits metal on the dielectric layer, and in the openings of the dielectric layer, to form a metal layer. The metal layer may have at least two sub-layers, including a refractory metal barrier, and another layer, which may contain aluminum. The system patterns the metal layer to form a top capacitor plate and bond pads.

In a block 666, the system deposits protective layers over the metal layer deposited in the block 664. For example, the system deposits a first layer of protective overcoat, which may be composed of silicon dioxide. The first protective overcoat layer may be formed by an HDP process or by a PTEOS process. Then, the system deposits a second protective overcoat layer, for example silicon oxynitride, over the first protective overcoat layer. The system etches the first protective overcoat layer and the second protective overcoat layer to expose a portion of the top capacitor plate and a portion of the metal layer, forming bond pads. The system deposits a top polyimide layer on the second protective overcoat layer.

Figure 8:
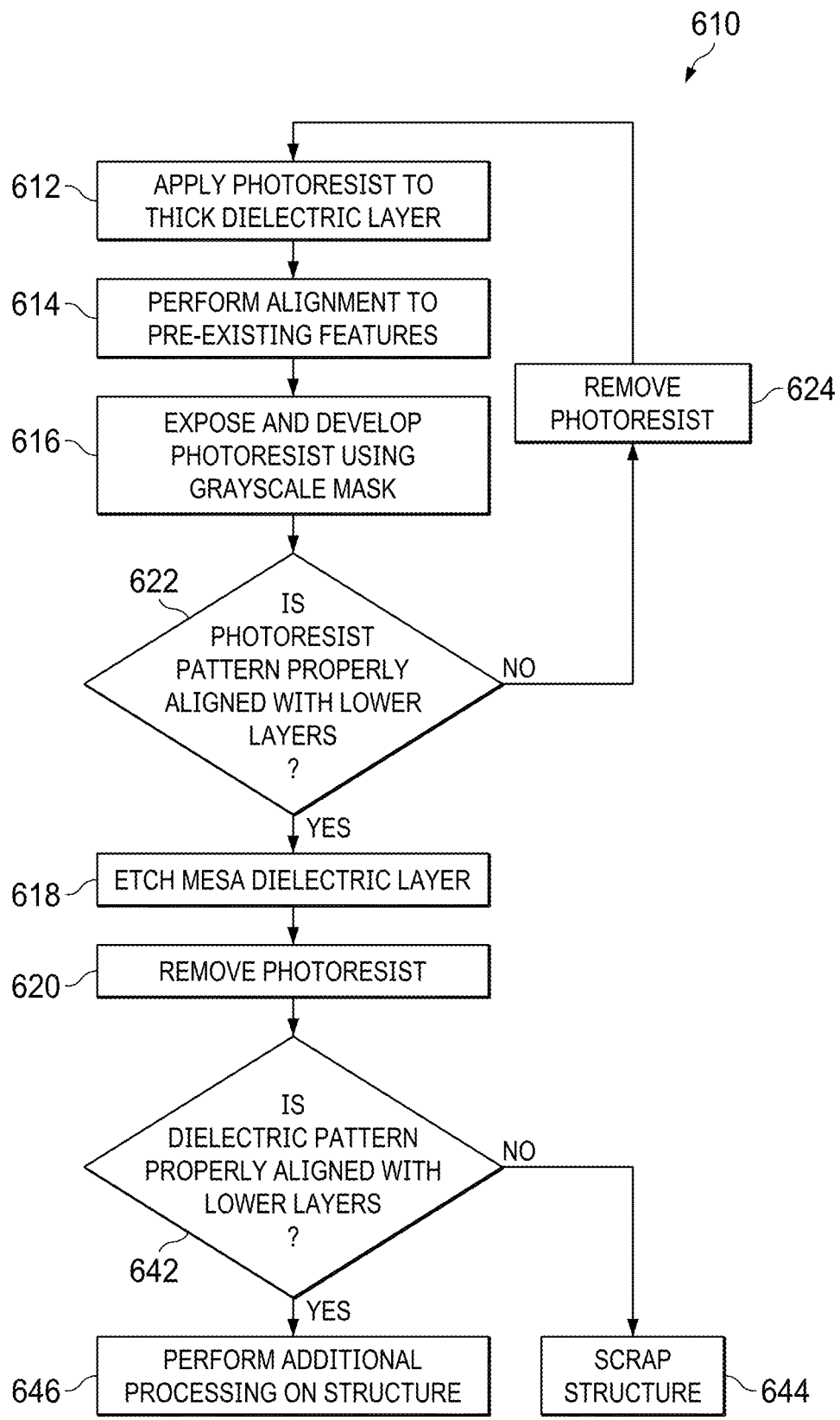
FIG. 8 illustrates a flowchart for an example method of generating MESA graybox alignment modules.

FIG. 8 illustrates the flowchart 610 for an example method of forming a MESA alignment mark in a MESA dielectric layer. The flowchart 610 may perform the steps illustrated by the block 660 of FIG. 7. In the block 612, a system applies photoresist to a MESA dielectric layer, a thick dielectric. In an example, the MESA dielectric layer is between about 5 µm and about 20 µm, for example 6-10 µm. Below the MESA dielectric layer is a substrate, which may contain various devices, such as MOS transistors, bipolar transistors, FETs, diodes, resistors, inductors, capacitors, and other devices, and their interconnection. Also, below the MESA dielectric substrate are various layers, such as a first ILD oxide layer with MET1, a second ILD oxide layer with MET2, a third ILD oxide layer with MET3, and a fourth ILD layer with copper.

In the block 614, the system optically aligns a grayscale mask to pre-existing features below the dielectric layer, such as MET3 features or copper features. The grayscale mask may contain opaque regions, clear regions, and one or more dithered regions with varying opacity. The alignment performed in the block 614 may be problematic, because the metal features below the dielectric layer are far below the top surface of the thick dielectric layer. The thick dielectric layer may be, for example, between about 5 µm thick and about 10 µm thick. The photoresist may add from about 2 µm to about 4 µm of height. In some embodiments, a thinner dielectric layer, or a layer composed of another material, such as a semiconductor, is used.

In the block 616, the system exposes and develops the photoresist using the grayscale mask aligned in the block 614, to generate an exposed photoresist layer. The exposed photoresist layer includes a thick photoresist pattern in one region, a thin photoresist pattern in another region, with a gap between the thin photoresist pattern and the thick photoresist pattern. The thick photoresist pattern is beneath an opaque region of a grayscale mask, the thin photoresist pattern is beneath a dithered region of the grayscale mask, and the gap region is beneath a transparent region of the grayscale mask. In an embodiment, the height of the thin photoresist pattern is less than half the height of the thick photoresist pattern. In another embodiment, the height of the thin photoresist pattern is less than a third the height of the thick photoresist pattern. In an embodiment, the thin photoresist pattern includes an outer photoresist box and an inner photoresist box inside the outer photoresist box. The height of the inner photoresist box may be less than the height of the outer photoresist box. In an example, the outer photoresist box is beneath a medium density dithered pattern of a grayscale mask and the inner photoresist box is beneath a lower density dithered pattern of the grayscale mask. The exposed photoresist layer may also include a very thick photoresist pattern in a high voltage capacitance region. For positive photoresist, the photoresist is fully or almost fully removed under the transparent regions, fully or almost fully retained in regions below the opaque regions, and partially removed in partially opaque dithered regions. For negative photoresist, the photoresist is fully or almost fully removed in regions below the opaque regions, fully or almost fully retained in regions below the transparent regions, and partially retained in regions below the partially opaque grayscale regions. The photoresist may have a pattern at a moderate height, for example about 1 μm, in the vicinity of an alignment structure in a scribe lane. In one example, the photoresist forms a square with slanted slopes in the scribe lane. In another example, the photoresist has a relatively higher moderate height frame with a lower moderate height depression in the center.

In the block 622, the system determines whether the photoresist pattern is properly aligned with the lower metal layers using an optical imaging system. The portions of the photoresist that are partially removed have a top surface that is closer to the top of the thick dielectric layer, and to the layers below the thick dielectric layer, than the full thickness of the photoresist. For example, they may have a thickness of between about 0.75 μm and about 2 μm, for example about 1 μm. When the photoresist is properly aligned with the lower metal layers, the system proceeds to the block 618. On the other hand, when the photoresist is not properly aligned with the lower metal layers, the system proceeds to the block 624.

In the block 624, the system removes the photoresist layer. The system removes both the thin photoresist pattern and the thick photoresist pattern. Then, the system proceeds to the block 621 to again apply a photoresist layer to the thick dielectric layer, and to again perform alignment and exposure.

In the block 618, the system etches the photoresist patterned MESA dielectric layer. The pattern from the photoresist is transferred to the MESA dielectric layer below. The areas of the dielectric below the portions with full photoresist are not etched, or are minimally etched, and the portions of the dielectric below areas with little or no photoresist are mostly etched. Because the photoresist is consumed at a finite rate during the etch process, the portions of the dielectric below areas with a thinner layer of photoresist are partially etched. A MESA graybox alignment mark may be formed in a scribe lane. The creation of intermediate height features in the thick MESA dielectric may occur when the photoresist thickness on the dielectric is sufficiently thin that it is fully consumed prior to the end of the etching process, and the dielectric layer under the resist is etched for a time less than the full duration of the etching process. Accordingly, the grayscale pattern in the photoresist is transferred to the dielectric layer below. This MESA graybox alignment mark may be used for verification of alignment. In an embodiment, an alignment mark with both an outer MESA graybox and an inner MESA graybox within the outer MESA graybox, is formed. The height of the inner MESA graybox is less than the height of the outer MESA graybox. Also, the system may form a MESA capacitor dielectric in the high voltage capacitance region.

In the block 620, the system removes the photoresist that survived the etching process.

In the block 642, the system determines whether the MESA dielectric pattern is properly aligned to the lower metal layers. For example, visual imaging may be performed on the alignment mark in the scribe lane. In an embodiment, the system images the MESA alignment mark on the structure. While imaging the MESA alignment mark, the system images a metal later beneath the alignment mark. The MESA alignment mark may be a MESA graybox. Based on the imaging of the MESA alignment mark and the metal structure, the system determines whether the MESA alignment mark is aligned with the metal layer. When the MESA dielectric pattern is properly aligned with the lower layers, the system proceeds to the block 646, and performs additional processing on the structure. The additional processing, for example, may include depositing and patterning a top metal layer to form the top capacitor plate on the capacitor MESA dielectric. The system may saw the scribe lane to singulate the integrated circuits from the array of units on the wafer. On the other hand, when the dielectric pattern is not properly aligned with the lower layer, the system proceeds to the block 644, and determines that this integrated circuit fails. The system may scrap the structure, including the integrated circuit.

Figure 9A:
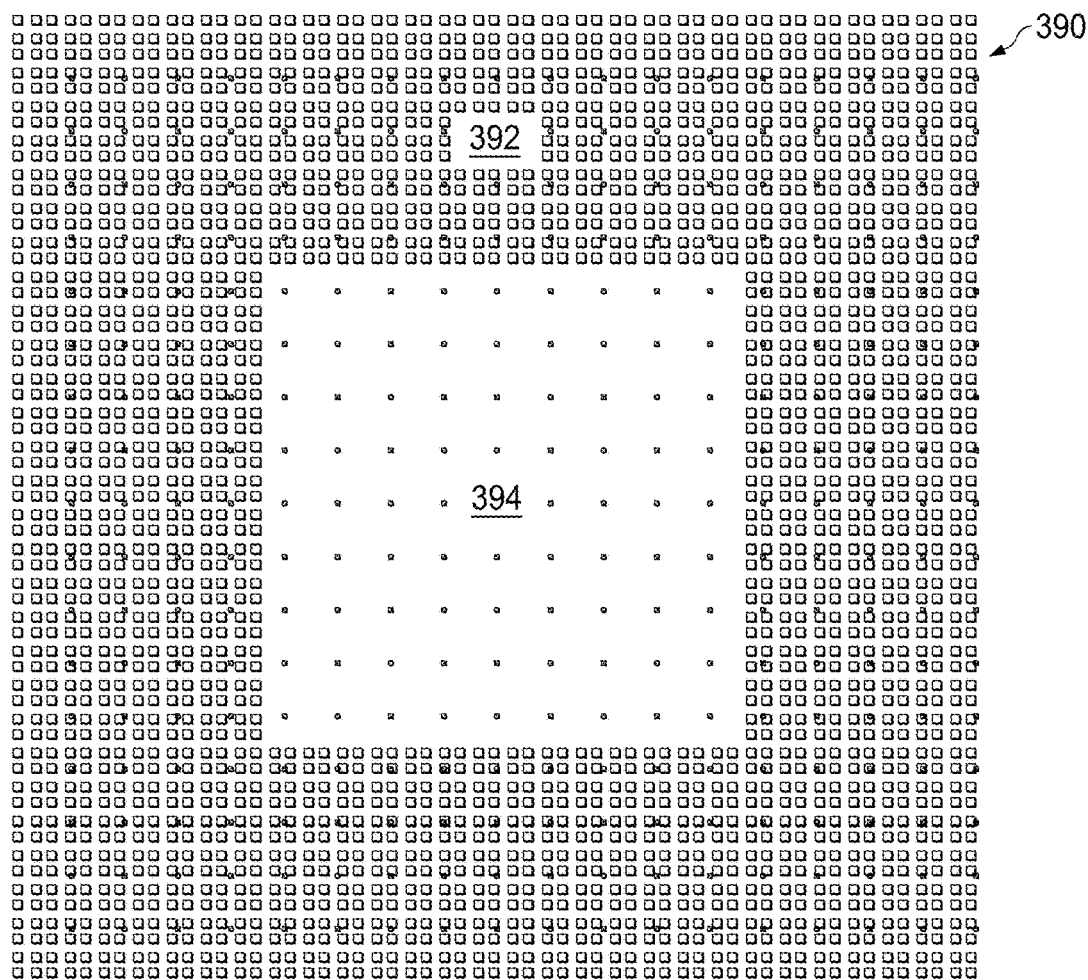
FIGS. 9A-B illustrate example grayscale masks and MESA graybox alignment structures.
Figure 9B:
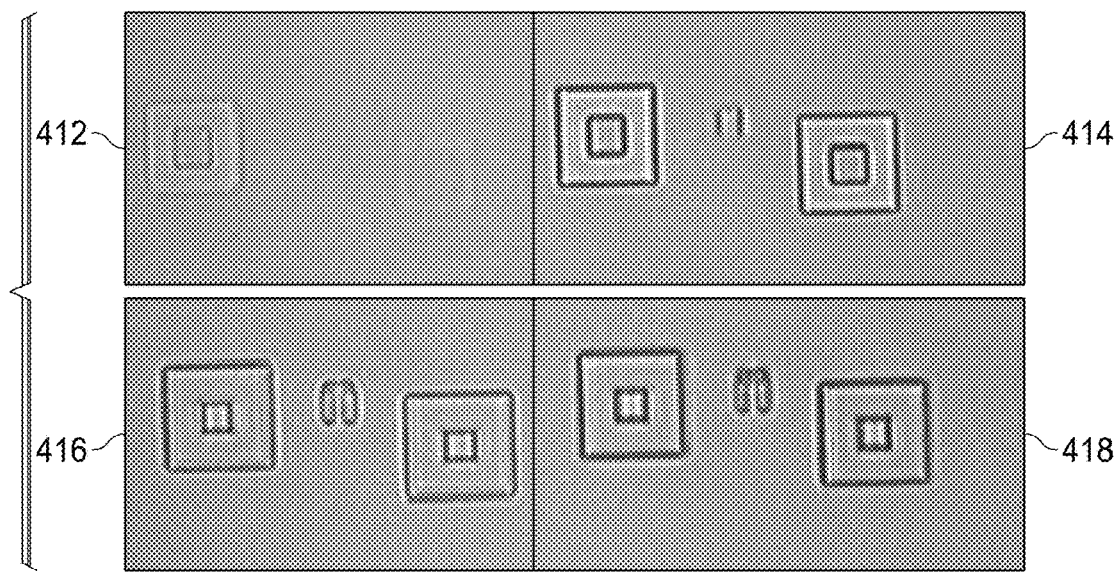

FIGS. 9A-B illustrate example grayscale masks and MESA alignment structures. FIG. 9A illustrates the dithered grayscale mask 390 with two levels of dithering. The dithered grayscale mask 390 includes the outer region 392 with heavier dithering and the inner region 394 with lighter dithering. The outer region 392 contains higher dithering and the inner region 394 contains lighter dithering. The outer region 392 forms an outer MESA graybox and the inner region 394 forms an inner MESA graybox.

FIG. 9B illustrates examples of alignment marks created using the dithered grayscale mask 390 with various percent dithering and energy levels. A 4.0 μm i-line photoresist, with a stepper and an exposure matrix produce the marks. The block 412 shows the marks with 10% dithering and 3000 mJ exposure, the region 414 shows the marks with 20% dithering and 3000 mJ exposure, the region 416 shows the marks with 10% dithering and 2500 mJ exposure, and the region 418 shows the marks with 20% dithering and 2500 mJ exposure. From these results, a higher percent of dithering may produce sharper marks. In some examples, a higher percent of dithering, for example 25%, 30%, 35%, or 40%, may be used. Different values are optimal for different photolithography processes.

Although the example illustrative arrangements have been described in detail, it should be understood that various changes, substitutions and alterations can be made herein without departing from the spirit and scope of the present application as defined by the appended claims.

Moreover, the scope of the present application is not intended to be limited to the particular illustrative example arrangement of the process, machine, manufacture, and composition of matter means, methods and steps described in this specification. As one of ordinary skill in the art will readily appreciate from the disclosure, processes, machines, manufacture, compositions of matter, means, methods or steps, presently existing or later to be developed, that perform substantially the same function or achieve substantially the same result as the corresponding example arrangements described herein may be utilized according to the illustrative arrangements presented and alternative arrangements described, suggested or disclosed. Accordingly, the appended claims are intended to include within their scope such processes, machines, manufacture, compositions of matter, means, methods, or steps.

What is claimed is:

1. A method of fabricating an integrated circuit, the method comprising:
   applying photoresist to a MESA dielectric layer of a semiconductor structure, to generate a photoresist layer; and
   exposing the photoresist layer with a grayscale mask, to generate an exposed photoresist layer, comprising forming a high voltage capacitor region, the exposed photoresist layer comprising:
      a thick photoresist pattern in a first region; and
      a thin photoresist pattern in a second region, wherein a height of the thin photoresist pattern is less than half a height of the thick photoresist pattern.

2. The method of claim 1, wherein a height of the high voltage capacitor region is greater than the height of the thick photoresist pattern.

3. The method of claim 2, further comprising:
   determining whether the thin photoresist pattern is aligned to metal features below the MESA dielectric layer; and
   etching the MESA dielectric layer, in response to determining that the thin photoresist pattern is aligned to the metal features, to generate an alignment mark in a scribe lane; and
   removing the thin photoresist pattern and the thick photoresist pattern, in response to determining that the thin photoresist pattern is not aligned to the metal features.

4. The method of claim 3, further comprising:
   forming a MESA capacitor dielectric in the high voltage capacitor region, in response to determining that the thin photoresist pattern is aligned to the metal features.

5. The method of claim 4, wherein the alignment mark comprises a MESA graybox, wherein a height of the MESA graybox is less than half of a height of the MESA capacitor dielectric.

6. The method of claim 3, wherein the alignment mark comprises:
   an outer MESA graybox; and
   an inner MESA graybox within the outer MESA graybox, wherein a height of the inner MESA graybox is less than a height of the outer MESA graybox.

7. The method of claim 1, wherein the thin photoresist pattern comprises:
   an outer photoresist graybox; and
   an inner photoresist graybox inside the outer photoresist graybox, wherein a height of the inner photoresist graybox is less than a height of the outer photoresist graybox.

8. The method of claim 7, wherein the outer photoresist graybox is beneath a medium density dithered pattern of the grayscale mask and the inner photoresist graybox is beneath a lower density dithered pattern of the grayscale mask.

9. The method of claim 7, further comprising, before applying photoresist to the MESA dielectric layer:
   forming an inter-layer dielectric (ILD) oxide layer on a substrate;
   forming a metal frame structure in the ILD oxide layer;
   forming a metal plate structure in the ILD oxide layer; and
   forming the MESA dielectric layer over the ILD oxide layer; and
   wherein the metal frame structure is below the outer photoresist graybox and the metal plate structure is below the inner photoresist graybox.

10. The method of claim 9, wherein the metal frame structure and the metal plate structure comprise copper, aluminum, or an aluminum alloy.

11. The method of claim 1, the exposed photoresist layer further comprising a gap region between the thick photoresist pattern and the thin photoresist pattern, wherein the thick photoresist pattern is beneath an opaque region of the grayscale mask, the thin photoresist pattern is beneath a dithered region of the grayscale mask, and the gap region is beneath a transparent region of the grayscale mask.

12. The method of claim 1, wherein the height of the thin photoresist pattern is less than a third of the height of the thick photoresist pattern.

13. A method of fabricating an integrated circuit, the method comprising:
   imaging a MESA alignment mark on a structure, wherein the MESA alignment mark comprises a MESA graybox of a MESA dielectric layer, and wherein a height of the MESA graybox is less than half of a height of a MESA capacitor dielectric of the MESA dielectric layer;
   imaging a metal layer, while imaging the MESA alignment mark, wherein the metal layer is beneath the MESA alignment mark; and
   determining whether the MESA alignment mark is aligned with the metal layer, based on imaging the MESA alignment mark and imaging the metal layer.

14. The method of claim 13, further comprising scrapping the structure in response to determining that the MESA alignment mark is not aligned with the metal layer.

15. The method of claim 13, further comprising performing additional processing on the structure, forming the integrated circuit, in response to determining that the MESA alignment mark is aligned with the metal layer.

16. A method of fabricating an integrated circuit, the method comprising:
   applying photoresist to a MESA dielectric layer of a semiconductor structure, to generate a photoresist layer; and
   exposing the photoresist layer with a grayscale mask, to generate an exposed photoresist layer, the exposed photoresist layer comprising:
      a thick photoresist pattern in a first region; and
      a thin photoresist pattern in a second region, wherein the thin photoresist pattern comprises a photoresist graybox.

17. The method of claim 16, wherein the thin photoresist pattern comprises:
   an outer photoresist graybox; and
   an inner photoresist graybox inside the outer photoresist graybox, wherein a height of the inner photoresist graybox is less than a height of the outer photoresist graybox.

18. The method of claim 17, wherein the outer photoresist graybox is beneath a medium density dithered pattern of the grayscale mask and the inner photoresist graybox is beneath a lower density dithered pattern of the grayscale mask.

19. The method of claim 17, further comprising, before applying photoresist to the MESA dielectric layer:
   forming an inter-layer dielectric (ILD) oxide layer on a substrate;
   forming a metal frame structure in the ILD oxide layer;
   forming a metal plate structure in the ILD oxide layer; and forming the MESA dielectric layer over the ILD oxide layer; and wherein the metal frame structure is below the outer photoresist graybox and the metal plate structure is below the inner photoresist graybox.

20. The method of claim 19, wherein the metal frame structure and the metal plate structure comprise copper, aluminum, or an aluminum alloy.

* * * * *